US010416643B2

(12) United States Patent
Weber et al.

(10) Patent No.: US 10,416,643 B2
(45) Date of Patent: Sep. 17, 2019

(54) SMART HOME SYSTEM AND METHOD

(71) Applicant: YOTTA GREEN LTD, Or Yehuda (IL)

(72) Inventors: Zvika Weber, Reut (IL); Moshe Gad Vekslar, Reut (IL)

(73) Assignee: YOTTA GREEN LTD, Or Yehuda (IL)

( * ) Notice: Subject to any disclaimer, the term of this patent is extended or adjusted under 35 U.S.C. 154(b) by 0 days.

(21) Appl. No.: 15/519,414

(22) PCT Filed: Sep. 24, 2015

(86) PCT No.: PCT/IL2015/050974
§ 371 (c)(1),
(2) Date: Apr. 14, 2017

(87) PCT Pub. No.: WO2016/059627
PCT Pub. Date: Apr. 21, 2016

(65) Prior Publication Data
US 2017/0235290 A1 Aug. 17, 2017

Related U.S. Application Data

(60) Provisional application No. 62/063,628, filed on Oct. 14, 2014.

(51) Int. Cl.
| | | |
|---|---|---|
| *G05B 19/042* | (2006.01) | |
| *H02J 3/14* | (2006.01) | |
| *H02J 13/00* | (2006.01) | |
| *H04L 12/28* | (2006.01) | |
| *H04W 4/04* | (2009.01) | |
| *G01R 21/133* | (2006.01) | |

(52) U.S. Cl.
CPC ............ *G05B 19/0426* (2013.01); *H02J 3/14* (2013.01); *H02J 13/0006* (2013.01); *H02J 13/0062* (2013.01); *H04L 12/2809* (2013.01); *H04L 12/2825* (2013.01); *H04L 12/2834* (2013.01); *H04W 4/04* (2013.01); *G01R 21/133* (2013.01); *G05B 2219/2642* (2013.01); *H02J 2003/143* (2013.01); *H04L 2012/285* (2013.01); *Y02B 70/3225* (2013.01); *Y02B 70/3266* (2013.01); *Y04S 20/222* (2013.01); *Y04S 20/242* (2013.01)

(58) Field of Classification Search
CPC .. G05B 19/0426; H02J 13/0062; H02J 13/14; H04L 12/2809; H04L 12/2825; H04L 12/2834; H04W 4/008; H04W 4/04
See application file for complete search history.

(56) References Cited

U.S. PATENT DOCUMENTS

| | | | |
|---|---|---|---|
| 9,477,299 B2 * | 10/2016 | Thompson | ............ G06F 1/3215 |
| 9,880,578 B2 * | 1/2018 | Tadano | .................. G06Q 10/04 |
| 2010/0070217 A1 | 3/2010 | Shimada et al. | |

(Continued)

*Primary Examiner* — Vincent H Tran
(74) *Attorney, Agent, or Firm* — Novick, Kim & Lee, PLLC; Jae Youn Kim

(57) ABSTRACT

An electrical management system for managing a smart home. A plurality of end units such as electrical outlets and electrical switches sample the electricity going through the end-unit at least 1,000 times per second. The information is communicated to a server, which analyzes the data across many installations and can alert the user for any abnormal electrical situation in the home.

17 Claims, 5 Drawing Sheets

(56) References Cited

U.S. PATENT DOCUMENTS

| | | | |
|---|---|---|---|
| 2010/0109619 A1* | 5/2010 | Tsou | H02J 3/14 323/234 |
| 2010/0191487 A1 | 7/2010 | Rada et al. | |
| 2010/0306033 A1* | 12/2010 | Oved | G06Q 10/06375 705/7.37 |
| 2011/0125329 A1* | 5/2011 | Oswald | G05B 15/02 700/276 |
| 2011/0313582 A1* | 12/2011 | van Megen | G01D 4/00 700/292 |
| 2012/0028097 A1 | 2/2012 | Oury | |
| 2012/0150359 A1* | 6/2012 | Westergaard | H02J 3/14 700/291 |
| 2012/0316808 A1 | 12/2012 | Frader-Thompson et al. | |
| 2014/0018094 A1 | 1/2014 | Oren et al. | |
| 2014/0068027 A1* | 3/2014 | Flacco | H04W 76/10 709/220 |
| 2015/0256355 A1* | 9/2015 | Pera | H04L 12/2803 700/90 |
| 2015/0362985 A1* | 12/2015 | Thompson | G06F 1/3215 713/323 |
| 2016/0041573 A1* | 2/2016 | Chen | G06F 1/266 700/295 |
| 2016/0091948 A1* | 3/2016 | Mitchell | G06F 1/3206 713/340 |

\* cited by examiner

SMART HOME SYSTEM AND METHOD

TECHNICAL FIELD

The present invention relates to electricity management systems in general, and in particular to systems and methods for managing electricity in a home or office.

BACKGROUND ART

The concept of Smart Home technology relates to managing electric appliances in a home or office. Some characteristics of appliances in a smart home include: the ability to communicate with a server, to be controlled remotely and on-location by a user, for example, via a mobile device or a computer; to communicate with each other, etc.

The term "Home" as referred to herein relates to a house, an office, building, factory or any indoor/outdoor environment with an electric network and connected appliances.

SUMMARY OF INVENTION

It is an object of the present invention to disclose systems and methods for managing electrical appliances.

It is another object of the present invention to disclose systems and methods for managing electricity consumption.

It is a further object of the present invention to disclose systems and methods for providing recommendations to reduce electricity consumption.

It is yet another object of the present invention to disclose systems and methods for predicting or recommending maintenance steps for an appliance.

It is yet a further object of the present invention to disclose systems and methods for predicting possible failure of an appliance.

The present invention thus relates to an electrical management system, comprising:
  (i) a plurality of end-units comprising electrical outlets and electrical switches, each end-unit comprising (1) a processor; (2) memory; (3) an electricity measurement unit for measuring the electricity going through said end-unit; and (4) a communication unit;
  (ii) a gateway application installed in an internet gateway connected to said plurality of end-units;
  (iii) a mobile device application connected to said gateway;
  (iv) a server connected to said gateway:
  wherein said electricity measurement unit measures the electricity going through the end-unit at least 1,000 times per second.

In some embodiments, the plurality of end-units comprise a timer, a scheduler, a dimmer, a temperature sensor or any combination thereof.

In some embodiments, the plurality of end-units communicate with said gateway by the ZIGBEE protocol.

In some embodiments, the plurality of end-units further comprise: humidity sensors, water sensors, presence sensors, gas sensors, doors and windows opening sensors, IR units for controlling televisions, IR units for controlling entertainment units and IR units for controlling air conditioning systems.

In some embodiments, the mobile device is a mobile phone, a tablet, a notebook computer, a Personal Digital Assistant (PDA) or a portable game console.

In some embodiments, the mobile device application uses the mobile device's gyro accelerometer, compass or any combination thereof in order to calculate the X,Y,Z coordinates of an end-unit.

In some embodiments, the mobile device connects to said end-units via Near Field Communication (NFC).

In some embodiments, the gateway and said plurality of end-units communicate via the ZIGBEE protocol.

In some embodiments, the gateway sends instructions to activate to deactivate an end-unit.

In some embodiments, at setup the mobile device application determines the ID of each end-unit.

In some embodiments, at setup each end-unit sends the mobile device application its end-unit ID.

In some embodiments, the end-units send the server information about electricity consumption.

In some embodiments, the server determines which electrical device is connected to an end-unit, via analysis of the electricity consumption reported by the end-unit.

In some embodiments, the server reports anomalies in the electricity consumption of an electric device connected to an end-unit.

In some embodiments, the server suggests ways to reduce energy consumption.

In some embodiments, the mobile device application is adapted for deducting the positioning coordinates X, Y, Z of each end-unit, when said mobile device touches said end-unit or is within 1 meter from said end-unit.

In another aspect the present invention relates to an electrical management method, comprising:
  (i) Installing a plurality of end-units comprising electrical outlets and electrical switches, each end-unit comprising (1) a processor; (2) memory; (3) an electricity measurement unit for measuring the electricity going through said end-unit; and (4) a communication unit;
  (ii) installing a gateway application in an internet gateway connected to said plurality of end-units;
  (iii) installing a mobile application on a mobile device connected to said gateway;
  (iv) connecting a server to said gateway:
  wherein said electricity measurement unit measures the electricity going through the end-unit at least 1,000 times per second.

MODES FOR CARRYING OUT THE INVENTION

In the following detailed description of various embodiments, reference is made to the accompanying drawings that form a part thereof, and in which are shown by way of illustration specific embodiments in which the invention may be practiced. It is understood that other embodiments may be utilized and structural changes may be made without departing from the scope of the present invention.

Figure 1:
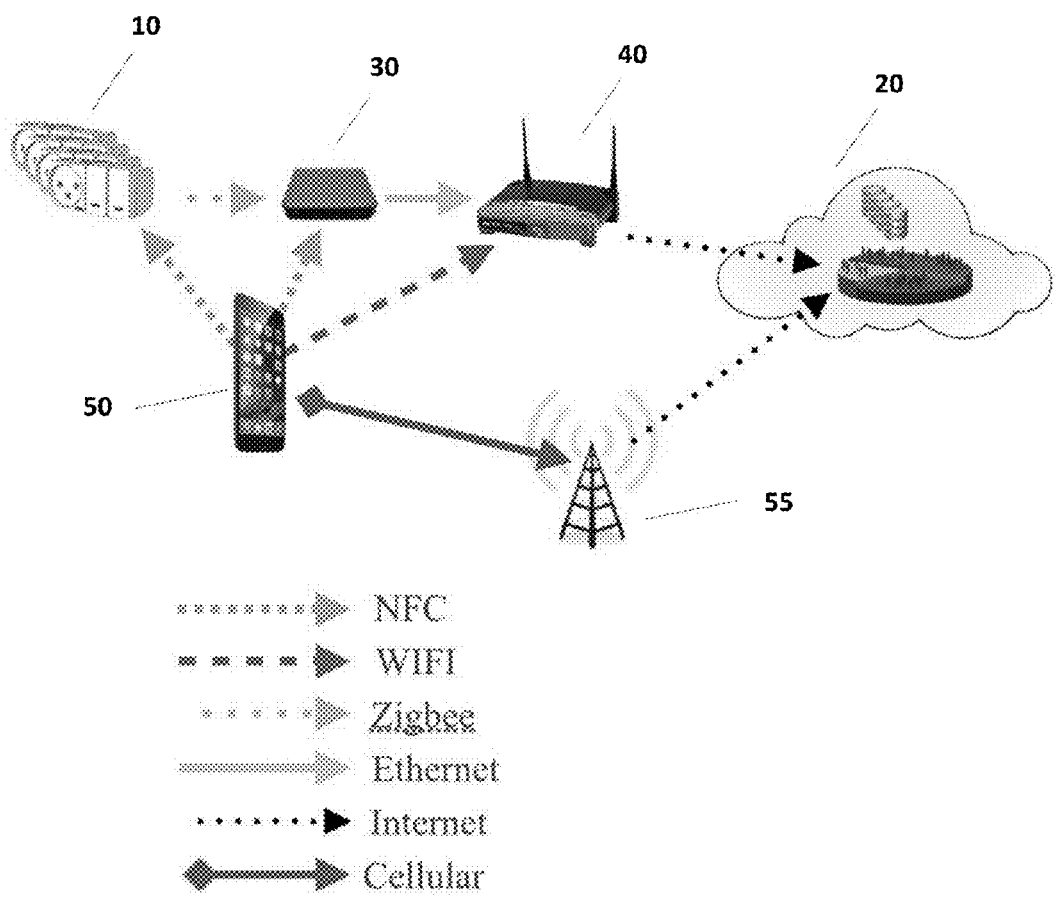
FIG. 1 is a block diagram of a system of the invention comprising end-units, connected to a gateway and a mobile device, the gateway connected to a router, and the router and mobile device also connected to a server.
Figure 2:
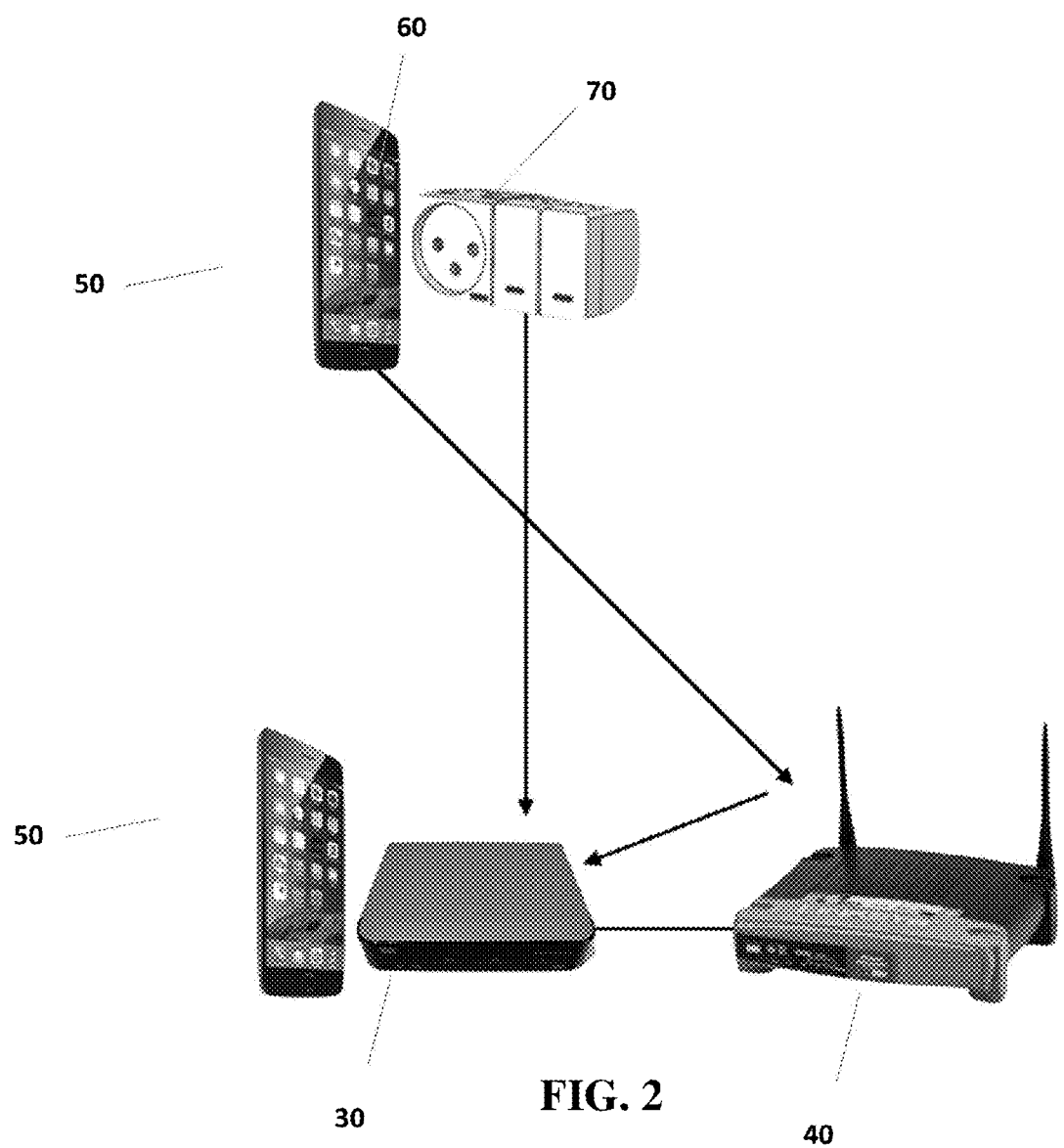
FIG. 2 illustrates the home installation process using NFC where the user touches with gateway and then the end-unit with the mobile device.

The electrical management system of the invention comprises a plurality of end-units, a gateway application installed in an internet gateway, a mobile device application and a server as shown in FIG. 1.

End-units 10 comprise electrical outlets and electrical switches of the invention. Such electrical outlets and electrical switches of the invention may look on the outside very similar to regular electrical outlets and electrical switches found in the market place. The installation to a wall and wiring of electrical outlets and electrical switches of the invention is similar to installation of regular electrical outlets and electrical switches. Actually, the person installing electrical outlets and electrical switches of the invention in a home or office may not notice anything unusual or different.

Each end-unit 10 of the invention comprises (1) a processor; (2) memory coupled to the processor; (3) an electricity measurement unit for measuring the electricity going through the end-unit; and (4) a communication unit.

The electricity measurement unit measures the electricity going through the end-unit continuously, that it at least 1,000 times per minute. The measured electricity consumption values are stored in the memory of the end-unit. The processor analyzes the stored values and decides what information about the electricity consumption should be communicated to the server 20. Communication to the server 20 is handled by the communication unit which sends out information to the server 20 via the Internet gateway 30 of the invention that is connected to a router 40. Typically, the processor only communicates changes in the electricity consumption, in order to minimize the communication energy and required bandwidth. The electricity measurement unit measures the power consumption in a high rate, for example, 1,000 to 2,500 times in a second. If the consumption value of the current measurement (V0) equals the last measurement (V−1), than no information needs to be sent out to the server 20. V0 can be determined to be equal to V−1 if the difference is less than a predefined threshold, for example, less than 0.5% difference between the 2 values.

If the value of V0 is determined not to be equal to V−1, for example, V0 is ±0.5% from V−1 than the system checks if it needs to send out a change in measured values by averaging the next measured values. For example, a given number of next measurements, for example, 10 measurements are averaged (V1−10a) and the average value is compared to V0. If V0 is higher or lower than V1−10a by a predefined threshold (for example, higher or lower by at least 0.5%) than the unit will send V1−10a to the server. The threshold value can be a variable.

The system further comprises a gateway application installed in an internet gateway 30. The internet gateway 30 is connected to all end-units 10 in a wired or wireless manner. The internet gateway 30 is also connected to a router 40.

The system further comprises a mobile device application installed on a mobile device 50. The mobile device 50 can be a mobile phone, a tablet, a notebook computer, a laptop computer, a portable game console, a smart watch or any similar present or future mobile device. The mobile device 50 connects to the internet gateway 30 wirelessly via a mobile base station 55 of a cellular network.

The system further comprises a server 20 connected to the internet gateway 30 in a wired or wireless manner.

Optionally, the system may further comprise different sensors such as a timer, a scheduler, a dimmer, a temperature sensor, humidity sensors, water sensors, presence sensors, gas sensors, doors and windows opening sensors, IR units for controlling televisions, IR units for controlling entertainment units and IR units for controlling air conditioning systems or any combination thereof.

The end-units 10 communicate with the Internet gateway 30 via wired or wireless communications, for example, using the ZIGBEE protocol.

Installation Procedure

Initially, end-units 10 comprising electrical outlets 60, electrical switches 70 and sensors of the invention should be installed in the home. The installation can occur when the home is being built or afterwards by replacing the existing electrical outlets and electrical switches.

The user downloads a mobile application of the invention to one or more of his mobile devices 50.

An Internet gateway 30 which includes the gateway application of the invention is connected to the router 40 serving the home where the system is installed.

Next, the mobile device 50 (containing the mobile application of the invention), is associated with the Internet gateway. In some embodiments, the mobile device connects with the Internet gateway via Near Field Communication (NFC) as shown in FIG. 1. Alternatively, other wireless or wired communication means are used to connect and associate the mobile device and the Internet gateway 30.

Next, the end-units 10 are activated and registered into the system of the invention. In some embodiments, the mobile device 50 connects with each end-unit 10, for example, via NFC by touching each end-unit 10 with the mobile device. Alternatively, the mobile device 50 and the end-units 10 connect via any other wireless or wired communications method.

When the end-units 10 are initially activated, their information is transmitted to the Internet gateway 30 by the mobile device 50. The end-unit 10 information comprises: end-unit ID, assigned name, general description, X,Y,Z coordinates in the home (latitude, longitude, height) and other optional information. The end-unit ID in the system can be decided by the mobile device 50 application and communicated to the end-unit 10 or alternatively, each end-unit 10 may initially come with an end-unit ID that is communicated to the mobile device 50. The mobile device 50, when touching the end-unit 10, can deduct its position in space (X,Y,Z coordinates) by using available technology on the mobile device 50 such as GPS, accelerometer, gyroscope, compass etc. The mobile device 50 can communicate with the Internet gateway 30 in any wireless or wired technology, for example, via WiFi, an Internet connection, NFC, Bluetooth etc.

In the initial installation process, each end-unit 10 may have particular parameters to define, for example, outlet always on (like for a refrigerator), dimmer disable/enable, on/off & fade functions, scheduler, timer etc. A timer decides how long the electricity will remain from start point, for example, turn the stairs light off after one minute or turn of the water heater one hour after it's turned on. A scheduler, performs routine on/off tasks at predetermined times, for example, turn the entrance light on a 8:00 PM and then off at 5:00 AM, or turn the air-conditioning on everyday at 6:00 PM (right before the tenants return from work).

Electrical outlets 60 and electrical switches 70 of the invention can be used by the user like regular electrical outlets and electrical switches, that is the user can manually turn on or off an electrical switch 70 and plug or unplug an appliance into an electrical outlet 60. In addition, electrical outlets 60 and electrical switches 70 of the invention can also be operated by the user via the mobile application of the invention. In addition, the application of the invention can also be used remotely, for example, from a work personal computer, so the user can manage, turn on or turn off electrical appliances in the home.

The server 20 of the invention collects and analyzes data based on information received from end-units 10 of the invention, technical specifications received from manufacturers of electrical appliances, and environmental information such as weather, humidity, daylight time etc.

The server 20 of the invention analyzes the behavior, patterns and electric consumption of appliances in a home, and issues reports, alerts about unusual values or behavior and recommendations for energy savings.

The Internet gateway 30 connects the internal network of a home to the Internet. The internal network of a home connects the home mobile devices 50 (telephones, tablets, portable computers, portable game consoles . . . ) and desktop computers both internally between the different devices and externally to the Internet. The Internet gateway 30 allows both wired and wireless communications. Wireless communications capabilities include WiFi for communication with computers and mobile devices 50 and also ZIGBEE for communicating with end-units 10 of the invention. The Gateway 30 receives the clock data from the network and can thus manage appliances according to a predetermined schedule, for example, turn on or off heating or air conditioning in the morning or in the evening.

Data Architecture

Figure 3:
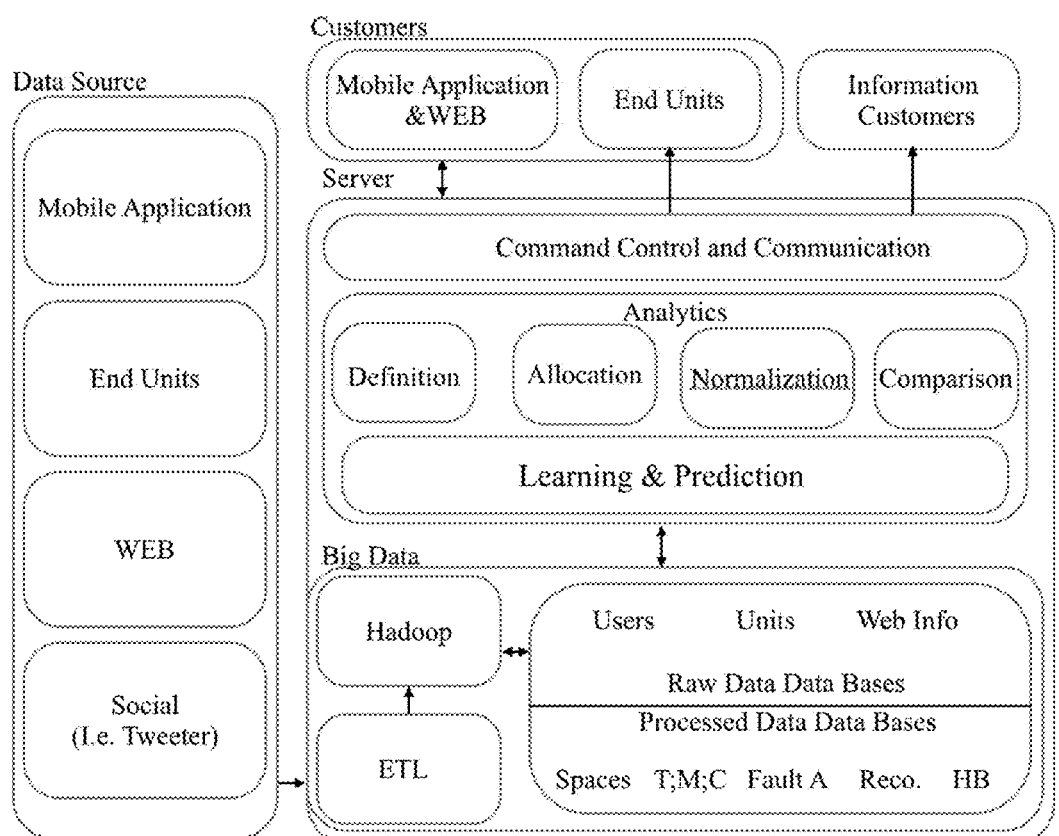
FIG. 3 is a block diagram of the data architecture.

Reference is now made to FIG. 3, showing a typical data architecture of the system of the invention. Typically, data is stored in a database coupled to the server 20 of the invention. Both the server 20 and the database can be in the cloud. The system of the invention gathers data from 4 sources:
1. The mobile application of the invention;
2. End-units 10 of the invention;
3. Internet for general information such as weather conditions, electricity prices, appliances pricing, appliances technical specifications etc.; and
4. Social network can supply information that may affect the home, for example, severe weather alerts, travel plans etc.

When the information is received by the server 20 it is passed to an Extraction Transformation Loading (ETL) unit which analyzes the received data, identifies and extracts relevant/pertinent information and then uploads the data to the database. In some embodiments, the information loading is performed by a MapReduce or similar process. MapReduce is a programming model and an associated implementation for processing and generating large data sets with a parallel, distributed algorithm on a cluster. In some embodiments, Hadoop Data File System (HDFS) is used in order to distribute the data among several clusters. Hadoop is a way of storing enormous data sets across distributed clusters of servers and then running "distributed" analysis applications in each cluster. In some embodiments, data is stored in an NoSQL format for easy writing and retrieval of the information.

Data received by the server 20, can be divided into two types of data: raw data and processed data.

Raw data comprises the following repositories:
Users data: name, address, optional payment information (for premium services) . . .
End-units 10: unique ID of each end-unit, all reports generated by end-units, positioning (X,Y,Z coordinates) of each end-unit in the home . . .
External information (from the Internet): weather data, humidity data, daytime data (sunrise and sunset), electricity pricing (for calculating usage costs), appliance pricing (for recommending the purchase of replacement appliances) . . .

Processed data comprises the following repositories:
Space—tracks all end-units identified to be located in the same open space (a room an office, a corridor etc.);
Type, model, contribution (TMC)—contains the electrical pattern (signature) of appliances by module and type, and their contribution to the space their located at, that is whether they contribute to heating or cooling that space;
Fault analysis—contains all failure patterns by make and model of appliance;
Recommendation—up to date recommendations for a user in order to save costs and improve the efficiency of the user's appliances;
Human behavior—tracks user behavior and actions.

Analytics

Pattern recognition—all end-units 10 of the invention, when connected to the electric network, measure continuously and with high precision the electric current going through the end-unit 10. The electricity measuring is performed by the electricity measurement unit of each end unit 10, in a frequency of at least 1,000 times per second and with a precision of 0.1 Watt. The measured electricity value is stored in the memory of the end-unit 10. The end-unit's 10 processor analyzes the measured values and communicates changes to the server. Such changes can be turning the appliance on or off or any increase or decrease in electricity consumption that is above a predetermined threshold value for the appliance. Communicating only the changes to the server 20 reduces both the data communications and data storage space.

One objective of analyzing the electricity consumption of an end-unit 10 is to first identify the type of appliance (refrigerator, air-conditioning unit, television set, light bulb etc.) by recognizing the electric pattern (signature) of the appliance and identifying the group that is characterized this type of pattern. It should be understood that different products of the same group, for example, different refrigerators, will have different actual patterns. The actual pattern of an appliance depends on different factors comprising: frequency of usage, energy efficiency of the appliance, type of user using the appliance, external conditions such as weather etc.

Figure 4:
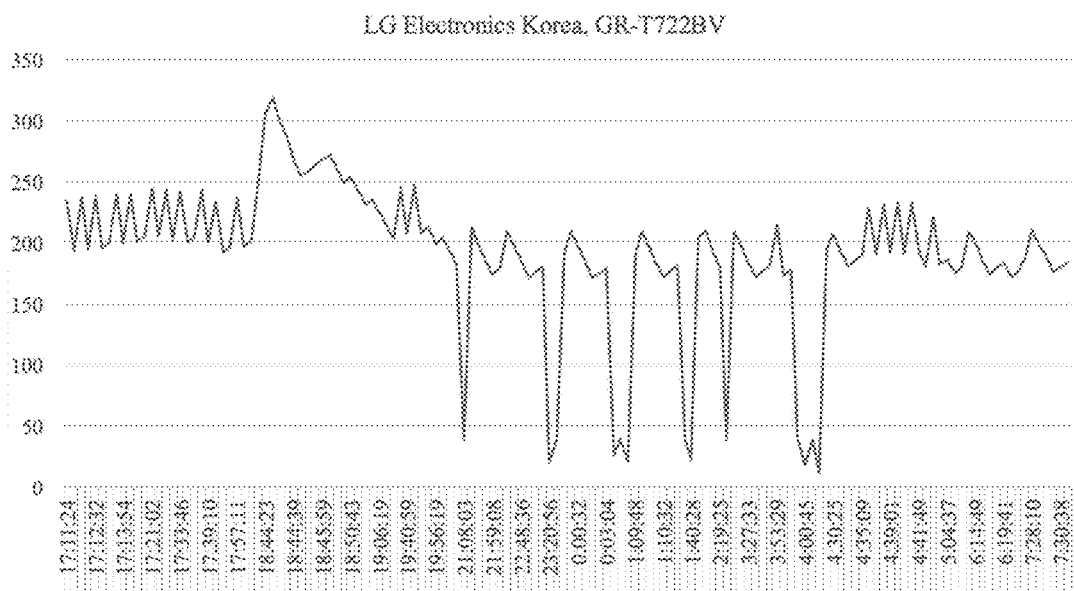
FIG. 4 is graph showing an example of the electricity consumption of an LG Electronics Korea, GR-T722BV model refrigerator over a few hours.

FIG. 4 is graph showing an example of the electricity consumption of an LG Electronics Korea, GR-T722BV model refrigerator over a few hours. A person skilled in the art would easily recognize the source of the changes in electricity consumption in this pattern. One can see the regular electricity consumption when the home is active, the opening of the refrigerator door (activating a light bulb of about 40 Watt), the activation of defrost (momentary increase up to 330 Watt), decrease to idle mode at night etc. The graph clearly identifies the general pattern of a refrigerator. A different appliance such as a washing machine, an air-conditioning unit, a television etc. will have a substantially different electricity consumption pattern along the day. For example, a washing machine is only active for a short period of time, and has no consumption most of the time. When the washing machine is active, it has clear cycles such as rinsing or spinning with different electricity consumption values. A television set on the other hand, has a steady minimal consumption value (when in sleep mode) and then very stable consumption values when turned on.

In some embodiments, identifying the type of appliance is achieved by using an algorithm of the type Nearest Neighbor Search (NNS). NNS is an optimization problem for finding closest (or most similar) points.

In some embodiments, measuring the activity of an appliance is performed by algorithm of the type Cycle Detection, which identifies repeating cycles of electricity consumption by comparing current measures with past measures.

An example of a Cycle Detection algorithm is shown below:

Is the algorithmic problem of finding a cycle in a sequence of iterated function values.

For any function $f$ that maps a finite set S to itself, and any initial value $x_0$ in S, the sequence of iterated function values $$X_0, X_1=f(X_0), \ldots X_2=f(X_1), \ldots X_i=f(X_{i-1}), \ldots$$

must eventually use the same value twice: there must be some $i \neq j$ such that $x_i = x_j$. Once this happens, the sequence must continue periodically, by repeating the same sequence of values from $x_i$ to $x_{j-1}$. Cycle detection is the problem of finding i and j, given $f$ and $x_0$.

Defining a Pattern for a Type of Electrical Appliance

Research along the years for identifying the pattern (signature) of electric appliances can be summarized in the table below:

TABLE 1

| identifying electricity pattern | | | |
|---|---|---|---|
| | 1st Approach | 2nd Approach | The Invention |
| Measurement Frequency | Low (every 10 minutes) | High (milliseconds) | High (milliseconds) |
| Measurement Length | Long (hours) | Short (seconds) | continuous |

Several families of electrical appliances can be defines:
Appliances that work continuously, like a refrigerator;
Appliances that work in mode ON/OFF, like a light bulb or a vacuum cleaner;
Appliances that work according to predefined programs, like a dish washer or a washing machine; and
Other appliances, like small kitchen appliance such as a blender or micro-wave oven.

Analytical Steps in the System

User Definition—in the setup process, the Internet gateway 30 (with the gateway application of the invention) is connected to the Internet, the user registers with the system, and after downloading the mobile application of the invention to the user's mobile device 50 (if not already installed), the home definition and registration starts. In some embodiments, the gateway 30 passes a security token to the user's mobile device 50, for example, via NFC when the mobile device 50 touches the gateway. The security token authenticates the mobile device 50 in the system, and enables the mobile device 50 to define the home network and register the end-units 10 of the invention. The security token also enables the mobile device 50 to authenticate other devices, for example, another mobile device 50 of a user in the home.

Home Network Definition—In some embodiments, the mobile device 50 registers every end-unit 10 of the invention, by touching each end-unit 10. A handshake is performed between the mobile device 50 and the end-unit 10 when they touch, via NFC communication. After the handshake, the end-unit 10 unique ID is registered in the system and the gateway 30 adds the end-unit 10 to the home network. In some embodiments, each end-unit 10 comes originally with a unique ID that is transmitted to the mobile device 50. Alternatively, the mobile device 50 can assign the end-unit 10 its unique ID, the end-unit 10 will then store its unique ID in memory. The user is able to define a name for the end-unit 10, so it's easier for the user to identify the end-unit 10. If the end-unit 10 is an electrical outlet 60 to which an appliance is connected, the user is able to provide a name for the appliance.

Defining positions of end-units 10 and spaces in the home—when the user initially walks and touches with the mobile device 50 every end-unit 10 in order to define it, the mobile device 50 calculates the exact position/location of the end-unit 10. The mobile device 50 uses all the available positioning technology including GPS, Accelerometer, Gyroscope, compass etc.

Every end-unit 10 position is also calculated relative to the precedent end-unit 10 registered and relative to the gateway. In this way, it is possible to map the electrical outlets 60 and switches 70 in the home. Electrical outlets 60 and switches 70 on the same wall or in close proximity will be assumed to be in the same space (room, office, corridor). The name assigned to each end-unit by the user, for example, "living room" or "parent bedroom" also helps to determine in which space in the home the end-unit 10 is located.

Defining sources of heat and cold—the user is asked to identify each end-unit 10 which is a light source (light equipment, light bulbs, electrical shutters . . . ), heat sources (light equipment, light bulbs, oven, refrigerator, air conditioning units), and also cooling sources (air conditioning units, doors or windows). The mutual effect of the different end-units 10 and heat and cold sources will later be checked to see if any improvements can be done. For example, in a hot environment, certain light bulbs may heat too much, and it would save air-conditioning energy if these light bulbs were replaced with other bulbs that heat less.

Identifying type of appliance and creating a signature—pattern recognition, as described above, allows the system to recognize appliances connected to electrical outlets or switches of the invention. Identification can occur in 3 levels:
1. Type—this is a refrigerator, dish washer etc.;
2. Type and model—this is a Whirlpool ADP4411 dishwasher; and
3. Finger print—identifying the exact appliance, for example, this is a Whirlpool ADP4411, serial number 1953431741684.

In order to more accurately identify an appliance, a database is created for storing appliance data including electricity consumption patterns. Users can be asked to provide information about their appliances. The response is not mandatory. The user may respond with any level of precision he wishes, for example:

The is a television set;
This is a Samsung television set;
This is a Samsung UE50H6400 television set; or
This is a Samsung UE50H6400 television set, serial number 7846584.

The more information in the database, the easier it will become to recognize an electrical appliance based on its electrical pattern.

Identifying the electrical signature of an appliance is based on the capacity of accurately measuring the electrical consumption of the appliance connected to an electrical outlet or switch. As discussed before, each end-unit 10 measures the electricity consumption at least 1,000 times per seconds, and in some cases even 2,500 times per second or more. In some embodiments, the electricity consumption is measured in accuracy of 0.1 Watt. The end-unit 10 reports to the server (via the gateway) changes in electricity consumption that it judges needed to be reported. Each report includes the end-unit ID, time stamp, Watts value and status.

Identifying the electrical pattern of an appliance correctly, will identify the type of appliance in question. When more data is available in the database, a further processing of the pattern may also identify the specific model of the appliance, based on its electrical behavior measurement sampled at a very high rate of at least 1,000 times per second.

Identifying a pattern change in an appliance—the current pattern of an appliance is first compared to the type pattern to make sure it is still the same appliance that is connected to the same end-unit 10. Then, the current pattern is compared with past data over several cycles. Each appliance has its own individual cycle pattern. For example, a dish washer is active the entire year, while air-conditioning is only active in the hot season. The comparison of present and past patterns will aim to normalize the pattern against both internal variables in the home (number of people, temperature, humidity, light etc.) and external variables (temperature, humidity, light etc.). The result will be that anomalies in the pattern of an appliance can be communicated to the user, sometimes with pertinent information to repair the situation. For example, cleaning the air conditioning filter may lead to 15% reduction in electricity consumption of the air-conditioning unit.

Figure 5:
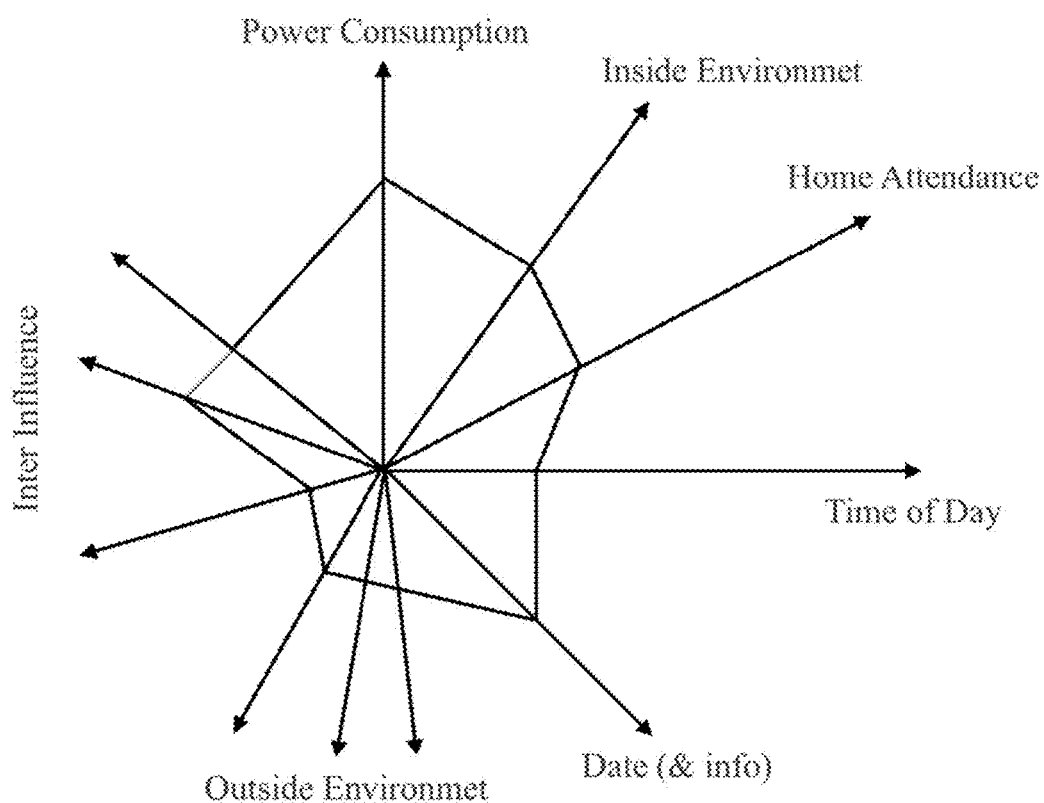
FIG. 5 illustrates measured values that are normalized among different homes.

Comparing appliances in different locations—behavior of the same appliance (make and model) in different homes can be compared in order to understand what is considered normal behavior for that kind of an appliance and what would be considered abnormal behavior. Initially, the ID of all appliances will be verified against the identified make and model to make sure no change has occurred. Then, the average consumption over time will be calculated. Then, a specific appliance pattern will be compared to the calculated average pattern in order to identify any deviation from the average that is deemed significant enough to be reported to the client. FIG. 5 shows a graph of different factures to be considered when normalizing data in different locations and geographies, for example, power consumption, inside environment, home attendance, time of day, outside environment, date and special information (holidays etc.) and interinfluence. The inside polygon illustrates the weight assigned to each factor.

Learning usage patterns of the location—all electrical events in a location (home, office, factory etc.) are identified by the end-units 10 of the invention, and relevant events are reported to the server 20. The server 20 analyzes the habits of the users to detect regular usage patterns and exception. For example, if users are never at home in the middle of the week and suddenly, at midday the lights are turned on in the living room, this is an exception that can be reported to the user. Maybe thieves broke in the house, a child is skipping school etc. The system can take into account weekends and holidays when issuing alerts.

Usage analysis can produce important information about the users of the home. For example, going to the bathroom (turning on the light of bathroom) several times each night, may signal elderly people in the house.

A user, with the right authorizations, may also get alerts for other homes. For example, a user having elderly parents living alone may be alerted something exceptions are noted in the parent's activities. For example, assuming the parents wake up every day by 8:00 AM, use the bathroom (light the light in the bathroom), and activate the electric kettle by 9:00 AM. If one morning, no light is turned on in the bathroom and the electric kettle is not activated by 10:30 AM, the user may be alerted. The types of alerts (event, time) can be fully customized by the user. The user may also update the system about upcoming events such as his parents going on vacation on such dates, so that the system does not count inactivity in those days as an exception.

System recommendations—the system gathers information about the electric consumption of an appliance, and if the make and model are known, compares it with the electrical consumption of similar appliances in other homes. Changes in the electric consumption may signal a situation that an improvement can be recommended to the user. For example, if the electric consumption of an air condition unit suddenly increases for a period of time (and the weather has not become hotter), it may signal that the filters need to be cleaned. The system can thus issue a recommendation for the user "please verify if filters are clean". The system can also present the recommendation as a question to the user "have you cleaned the air conditioning filters recently?", and learn from the user's response.

Failure and maintenance predictions—some electrical appliances may present an abnormal electric behavior before failures or degradations. The system gathers data about all appliances it manages. By comparing electrical patterns before failures or degradations in a many appliances of the same type, the system is able to identify determined patterns that signal an upcoming failure or degradation. The system is thus able to alert the user in such cases, that the appliance is facing possible failure or degradation in a given time frame. The system is then able to present the user with possible actions, such as, clean this part, replace this part, perform maintenance on this part or consider replacing the appliance. In some embodiments, the system is connected to online commerce sites and is able to offer the user to buy a given appliance to replace an existing appliance.

Electric consumption predictions—after gathering electrical consumption data over a period of time and taking into account the weather conditions, the system can predict consumption in a home for a given weather. Such information can be given to the user if he wishes to budget future usage. Alternatively, given user authorizations, the information can be aggregated and communicated to the electricity company.

Outputs of the System

The system can show the electric consumption of a home over a period of time taking into account the internal temperature in the home, the external temperature and the relative external humidity. External temperature and humidity information can be retrieved from public information on the internet and/or from external sensors connected to the system. Internal temperature and/or humidity data are provided by sensors connected to the system. The system can further take into consideration in the analysis additional parameters such as sunset times, sundown times, school vacations, holidays, sun angle etc. Additional sensors both inside and outside the home are able to supply the system with more data. In some embodiments, the information is provided and analyzed for each space in the home, assuming home space (rooms, corridors . . . ) is available.

In order to compare electricity consumptions in different homes and geographies, the consumption data is normalized vis-à-vis internal and external temperature and humidity, sun radiation, sun angle on home, other power consumption status (fridge and heater behave differently than fridge and A/C) and other consumption values. When a new appliance connects to the system, the consumption values (over any period of time) are normalized and compared to reference values for the same appliance (same make and model).

For example, assume the system has electricity consumption data for 250 units of the LG1247-2 air conditioning (AC) unit. After normalization for each unit, the hourly consumptions values are added together, and the total is divided by 250 to retrieve the current reference value of that AC unit. Reference values may change over time where more data is available to the system. When a new LG1247-2 unit is connected to the system, its consumption is compared to the system reference value. If the difference is over a predetermined threshold value, the system may alert the user that the new unit consumes too much electricity compared to what's it's supposed to (too little is of course better, and doesn't require reporting).

The system is thus able to analyze consumption values of an appliance and alert the user for maintenance, degradation, failure or improvement suggestions. For example:

If the system notices that an AC unit gradually consumes more and more electricity, it's highly probable that the AC filters need to be cleaned. The user is told to check the air filters and clean them if necessary, thus reducing the electricity consumption.

If the system notices that the refrigerator compressor works much more frequently, compared to other units of the same make and model (normalized to weather conditions and number of door openings), the system can suggest that the refrigerator compressor might be faulty and should be checked by a technician.

The system can analyze the dish-washer frequency of usage and consumption and deduct that the dish-washer consumes too much electricity compared to newer and more efficient model. The system can suggest changing the dish-washer to recommend models (for example, from partners of online shopping sites), and even tell the user the Return-On-Investment: in how much time will the cost of the new dish-washer be recovered by reduction of the electricity bill.

Scenarios—in a given situation at home, several actions and needs can occur at the same time. For example, in a lunch scenario, a user might watch television, prepare lunch and then eat lunch. Each action might have different requirements in terms of temperature and ambient light. The system will analyze the current values (or position) of relevant items at the kitchen, in this case lighting, shutters (electric or mechanical) and air-conditioning. Lighting, temperature and humidity values in the kitchen are retrieved from installed sensors of the invention. The system might deduct that it would be better to increase the temperature by 4 degrees and increase the light by 3 degrees. The shutters are currently, partly closed and lighting is off. The system can start by suggesting opening the shutters. If the lighting is still not sufficient, some light bulbs will be dimmed to the right value. If the external temperature is cooler than the internal temperature (and the outside air is not considered polluted), the system can ask the user if he wishes to open a window to cool the kitchen. Alternatively, the AC unit can be turned on to cool the kitchen.

Some electric appliances like television sets, especially when operated by a remote control, are not turned off completely when the user presses the off button. Instead, the appliance goes into "sleep" mode, but still consumes electricity as the appliance always operates a module ready to accept the command from the remote control. Overtime, such electricity consumption, over several appliances in a home, may be significant. When the user uses the mobile application of the invention for turning on or off an appliance, the mobile application communicates with the Internet gateway 30 that then proceeds to command the electrical output of switch associated with the appliance. In this way, the appliance can be completely shut down when turned off to save electricity.

Although the invention has been described in detail, nevertheless changes and modifications, which do not depart from the teachings of the present invention, will be evident to those skilled in the art. Such changes and modifications are deemed to come within the purview of the present invention and the appended claims.

It will be readily apparent that the various methods and algorithms described herein may be implemented by, e.g., appropriately programmed general purpose computers and computing devices. Typically a processor (e.g., one or more microprocessors) will receive instructions from a memory or like device, and execute those instructions, thereby performing one or more processes defined by those instructions. Further, programs that implement such methods and algorithms may be stored and transmitted using a variety of media in a number of manners. In some embodiments, hard-wired circuitry or custom hardware may be used in place of, or in combination with, software instructions for implementation of the processes of various embodiments. Thus, embodiments are not limited to any specific combination of hardware and software.

A "processor" means any one or more microprocessors, central processing units (CPUs), computing devices, microcontrollers, digital signal processors, or like devices.

The term "computer-readable medium" refers to any medium that participates in providing data (e.g., instructions) which may be read by a computer, a processor or a like device. Such a medium may take many forms, including but not limited to, non-volatile media, volatile media, and transmission media. Non-volatile media include, for example, optical or magnetic disks and other persistent memory. Volatile media include dynamic random access memory (DRAM), which typically constitutes the main memory. Transmission media include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read.

Various forms of computer readable media may be involved in carrying sequences of instructions to a processor. For example, sequences of instruction (i) may be delivered from RAM to a processor, (ii) may be carried over a wireless transmission medium, and/or (iii) may be formatted according to numerous formats, standards or protocols, such as Bluetooth, TDMA, CDMA, 3G.

Where databases are described, it will be understood by one of ordinary skill in the art that (i) alternative database structures to those described may be readily employed, and (ii) other memory structures besides databases may be readily employed. Any illustrations or descriptions of any sample databases presented herein are illustrative arrangements for stored representations of information. Any number of other arrangements may be employed besides those suggested by, e.g., tables illustrated in drawings or elsewhere. Similarly, any illustrated entries of the databases represent exemplary information only; one of ordinary skill in the art will understand that the number and content of the entries can be different from those described herein. Further, despite any depiction of the databases as tables, other formats (including relational databases, object-based models and/or distributed databases) could be used to store and manipulate the data types described herein. Likewise, object methods or behaviors of a database can be used to implement various processes, such as the described herein. In addition, the databases may, in a known manner, be stored locally or remotely from a device which accesses data in such a database.

The present invention can be configured to work in a network environment including a computer that is in communication, via a communications network, with one or more devices. The computer may communicate with the devices directly or indirectly, via a wired or wireless medium such as the Internet, LAN, WAN or Ethernet, Token Ring, or via any appropriate communications means or combination of communications means. Each of the devices may comprise computers, such as those based on the Intel® Pentium® or Centrino™ processor, that are adapted to communicate with the computer. Any number and type of machines may be in communication with the computer.

The invention claimed is:

1. An electrical management system, comprising:
   (i) a plurality of end-units comprising electrical outlets and electrical switches, each end-unit comprising (1) a processor; (2) memory; (3) an electricity measurement unit for measuring electricity going through each end-unit; and (4) a communication unit;
   (ii) a gateway application installed in an internet gateway connected to said plurality of end-units;
   (iii) a mobile device application connected to said gateway; and
   (iv) a server connected to said gateway,
      wherein the server is configured to identify determined electric patterns that signal an upcoming failure or degradation, and to issue maintenance predictions,
      wherein said electricity measurement unit measures the electricity going through an end-unit at least 1,000 times per second, and
      wherein the server is further configured to compare behaviors of the end-unit in different homes in order to understand what is considered a normal behavior for the same end-unit and what would be considered an abnormal behavior.

2. The system according to claim 1, wherein said plurality of end-units comprise a timer, a scheduler, a dimmer, a temperature sensor or any combination thereof.

3. The system according to claim 1, wherein said plurality of end-units communicate with said gateway by the ZIGBEE protocol.

4. The system according to claim 1, wherein said plurality of end-units further comprise: humidity sensors, water sensors, presence sensors, gas sensors, doors and windows opening sensors, IR units for controlling televisions, IR units for controlling entertainment units and IR units for controlling air conditioning systems.

5. The system according to claim 1, wherein the system gathers data about the plurality of end-units in order to identify the determined electric patterns that signal the upcoming failure or degradation.

6. The system according to claim 1, wherein said electric patterns are normalized both against internal variables related to a location of the end-units and external variables.

7. The system according to claim 6, wherein said internal variables comprise the number of people at the location, location temperature, location humidity or light at the location.

8. The system according to claim 6, wherein said external variables comprise external temperature, external humidity or external light.

9. The system according to claim 1, wherein said gateway sends instructions to activate or deactivate an end-unit.

10. The system according to claim 1, wherein at setup the mobile device application determines an ID of each end-unit.

11. The system according to claim 10, wherein at setup each end-unit sends the mobile device application its end-unit ID.

12. The system according to claim 1, wherein the plurality of end-units send the server information about electricity consumption.

13. The system according to claim 12, wherein the server determines which electrical device is connected to said end-unit, via analysis of the electricity consumption reported by said end-unit.

14. The system according to claim 12, wherein the server reports anomalies in the electricity consumption of an electric device connected to the end-unit.

15. The system according to claim 12, wherein the server suggests ways to reduce the electricity consumption.

16. The system according to claim 1, wherein, said mobile device application is configured for deducting the positioning coordinate X, Y, Z of each end-unit, when said mobile device touches said end-unit or is within 1 meter from said end-unit.

17. An electrical management method, comprising:
   (i) installing a plurality of end-units comprising electrical outlets and electrical switches, each end-unit comprising (1) a processor; (2) memory; (3) an electricity measurement unit for measuring electricity going through each end-unit; and (4) a communication unit;
   (ii) installing a gateway application in an internet gateway connected to said plurality of end-units;
   (iii) installing a mobile application on a mobile device connected to said gateway;
   (iv) connecting a server to said gateway; and
   (v) identifying determined electric patterns that signal an upcoming failure or degradation and issuing maintenance predictions,
      wherein said electricity measurement unit measures the electricity going through an end-unit at least 1,000 times per second, and
      wherein the server is further configured to compare behaviors of the end-unit in different homes in order to understand what is considered a normal behavior for the same end-unit and what would be considered an abnormal behavior.

* * * * *